(12) United States Patent
Shyy et al.

(10) Patent No.: US 6,598,409 B2
(45) Date of Patent: Jul. 29, 2003

(54) THERMAL MANAGEMENT DEVICE

(75) Inventors: Wei Shyy, Gainesville, FL (US); Marianne Monique Francois, Gainesville, FL (US); Jacob Nan-Chu Chung, Gainesville, FL (US)

(73) Assignee: University of Florida, Gainesville, FL (US)

(*) Notice: Subject to any disclaimer, the term of this patent is extended or adjusted under 35 U.S.C. 154(b) by 0 days.

(21) Appl. No.: 09/874,656

(22) Filed: Jun. 4, 2001

(65) Prior Publication Data

US 2002/0050148 A1 May 2, 2002

Related U.S. Application Data

(60) Provisional application No. 60/209,335, filed on Jun. 2, 2000.

(51) Int. Cl.[7] .............................. F25B 1/00; F04B 17/00
(52) U.S. Cl. ...................................... 62/115; 417/413.1
(58) Field of Search ........................... 62/498, 115, 119; 417/322, 413.1

(56) References Cited

U.S. PATENT DOCUMENTS

| | | | | |
|---|---|---|---|---|
| 2,039,999 A | * | 5/1936 | Holyfield | 417/322 X |
| 4,392,362 A | | 7/1983 | Little | 52/514 R |
| 4,951,740 A | | 8/1990 | Peterson et al. | 165/32 |
| 5,099,311 A | | 3/1992 | Bonde et al. | 357/82 |
| 5,176,358 A | | 1/1993 | Bonne et al. | 251/30.05 |
| 5,412,535 A | | 5/1995 | Chao et al. | 361/700 |
| 5,435,152 A | * | 7/1995 | McCausland | 62/467 |
| 5,441,597 A | | 8/1995 | Bonne et al. | 156/644 |
| 5,457,956 A | | 10/1995 | Bowman et al. | 60/520 |
| 5,542,821 A | | 8/1996 | Dugan | 417/53 |
| 5,943,877 A | | 8/1999 | Chen | 62/402 |
| 5,966,957 A | | 10/1999 | Mälhammar et al. | 62/259.2 |
| 6,033,191 A | | 3/2000 | Kamper et al. | 417/322 |
| 6,085,831 A | | 7/2000 | DiGiacomo et al. | 165/104.33 |
| 6,106,245 A | | 8/2000 | Cabuz | 417/322 |
| 6,148,635 A | | 11/2000 | Beebe et al. | 62/498 |
| 6,164,081 A | | 12/2000 | Jensen et al. | 62/115 |
| 6,215,221 B1 | | 4/2001 | Cabuz et al. | 310/309 |

OTHER PUBLICATIONS

Article entitled "A Micro–Scale Membrane–Actuated Condenser/Evaporator For Enhanced Thermal Management" by Marianne M. Francois, Wei Shyy and Jacob N. Chung, Printed in the American Society of Mechanical Engineers, Proceedings of the ASME Heat Transfer Division—2000, International Mechanical Congress and Exposition, Nov. 5–10, 2000, Orlando, Florida, HDT–vol. 366–2, pp. 1–7.

* cited by examiner

Primary Examiner—William Wayner
(74) Attorney, Agent, or Firm—Akerman Senterfitt

(57) ABSTRACT

A miniature vapor compression cycle thermal management device includes a dropwise condenser and ejector. The device includes a flexible compressor membrane serving as the compressor. The compressor can be stimulated electrostatically and drives refrigerant charge through a closed loop defined by interconnected compressor, condenser, expansion, and evaporator structures. The condenser includes a flexible condensing membrane for dropwise condensation and for propelling condensed droplets of refrigerant from a cooled condensing surface into an expansion chamber. The overall structure and size of the device is similar to microelectronic packages, and it may be combined to operate with similar devices in useful arrays.

23 Claims, 9 Drawing Sheets

THERMAL MANAGEMENT DEVICE

This application claims priority to the U.S. provisional application No. 60/209,335, filed Jun. 2, 2000, which is incorporated herein in its entirety.

FIELD OF THE INVENTION

The present invention generally concerns a vapor compression refrigeration cycle thermal management devices and more particularly a modularized, high energy transfer rate, and gravity insensitive heat transfer device.

BACKGROUND OF THE INVENTION

More efficient and scalable thermal management systems are required in many applications ranging from electronics cooling to medical practice where localized cooling is needed as differentiated from macrocooling of a large environment.

For example, the drive for increased performance has led to smaller, faster transistors and consequently, integrated circuits with larger transistor density, higher Input/Output count, and faster clock frequency. The larger transistor density at nearly constant supply voltage and ever increasing clock frequencies has resulted in increased dynamic power dissipation. This increasing power must be dissipated by the thermal management scheme employed in the package. These trends are evidenced by the exponential increase of power density over time for state-of-the-art integrated circuits. In the latest projections of the Semiconductor Industry Association (1999), the total power dissipation is expected to push the present state-of-knowledge for thermal management. The challenge for the identification of a future thermal management technology arises from the requirement of the package to provide a robust mechanical support, a low-distortion electrical conduit for the incoming and outgoing signals, environmental protection, and thermal dissipation at low cost and high reliability.

Currently, several approaches to thermal management are used in production chip packages. For example, buoyancy-driven convective heat transfer from the heat sink to the ambient is employed for portable integrated circuit (IC) applications, while forced convection is used for high-performance IC applications. In the past, mainframe computers and supercomputers have employed complex and expensive closed-loop cooling systems using liquids. Most microprocessor and microelectronic systems have avoided closed-loop thermal management approaches due to their high cost, high power, high acoustic noise, and low reliability. These macro-scale techniques employing bulky refrigeration units are not compatible with many future microelectronic applications in high performance markets.

Efficient two-phase boiling and condensing systems capable of transferring more energy across a smaller temperature gradient can significantly help meet performance requirements for high power density and minaturized physical dimensions. Even though dropwise condensation offers heat transfer coefficients at least an order of magnitude higher than filmwise condensation, conventionally, filmwise condensation has been used in industrial condensers but not in miniaturized applications.

With the rapid advances in the area of micro-electro-mechanical systems (MEMS) in recent years, miniaturized devices are achieving higher energy effectiveness. Membranes are of particular interests in MEMS for their use as valves, pumps, and compressors in micro-fluidic devices. Membranes can use electrostatic, piezo-electric or thermal actuation to pressurize a fluid in a cavity. More recently, design concepts of miniaturized cooling systems have been proposed based on the refrigeration vapor-compression cycle (Shannon et al., 1999, and Ashraf et al., 1999). In particular, Shannon et al. (1999) have used an electrostatic diaphragm with valves to perform compression, whereas Ashraf et al. (1999) have used a centrifugal compressor. However both used conventional heat exchanger condenser and evaporator. The herein cyclic thermal management system is also based on the refrigeration vapor compression cycle, however possesses original components. In the herein system an actuated-membrane is adopted as the condensing surface as well as the ejecting device. Therefore the droplets ejected serve the dual purpose for maintaining dropwise condensation and creating a spray for highly efficient cooling.

Thus, there is a strong need for a compact, highly energy efficient device. Such a device could be connected with other similar devices to form arrays and could be incorporated in many useful devices.

SUMMARY OF THE INVENTION

These and other needs are met or exceeded by the present vapor compression cycle heat transfer device with a dropwise condenser. High efficiency cooling available in conventional large mechanical compressor vapor compression heat transfer devices is produced by the present invention in a substantially different physical embodiment similar to integrated circuit packagings, and which may be constructed using traditional and microfabrication techniques. Heating is also available from the device of the invention, since a portion of the device will expel heat into an adjacent atmosphere, fluid or object while another portion of the device will absorb heat from an adjacent atmosphere, fluid or object. Individual, self-contained devices of the invention draw little electrical power and may be interconnected with like devices to satisfy localized cooling or heating over a desired area of atmosphere, fluid or object.

A device of the invention includes a housing having integrated compressor, condenser, expansion, and evaporator structures, with the evaporator structure removing heat from an adjacent atmosphere, fluid or object and the condenser structure expelling heat into an adjacent atmosphere, fluid or object. The compressor structure includes a compressor body defining a compressor cavity and a flexible compressor diaphragm mounted in the compressor cavity that compresses refrigerant within the cavity and promotes circulation of the refrigerant through a closed path defined through the compressor, condenser, expansion, and evaporator structures.

The condenser structure is in fluid communication with the compressor structure and includes a flexible condenser diaphragm that promotes growth of a plurality of droplets to form upon a cooled condenser surface and propels the droplets from the condenser surface of the condenser diaphragm into the expansion structure. The expansion structure includes an expansion chamber in fluid communication with the condenser structure and which is in expansive receipt of the droplets propelled from the condenser diaphragm. Finally, the evaporator structure includes an evaporator chamber which is proximate a top end of the expansion chamber and which is in fluid communication with the expansion chamber and the compressor structure.

The device is modularized, energy efficient and gravity insensitive. It provides high cooling rates for electronic instruments, and offers a novel means for thermal management. It can also be scaled to accommodate different types of applications.

DETAILED DESCRIPTION OF THE DRAWINGS

Other objects, features and advantages of the will become apparent upon reading the following detailed description, while referring to the attached drawings, in which.

DETAILED DESCRIPTION OF THE INVENTION

The present invention is more particularly described in the following examples that are intended to be illustrative only since numerous modifications and variations therein will be apparent to those skilled in the art. As used in the specification and in the claims, the singular form "a," "an," and "the" may include plural referents unless the context clearly dictates otherwise.

Figure 1:
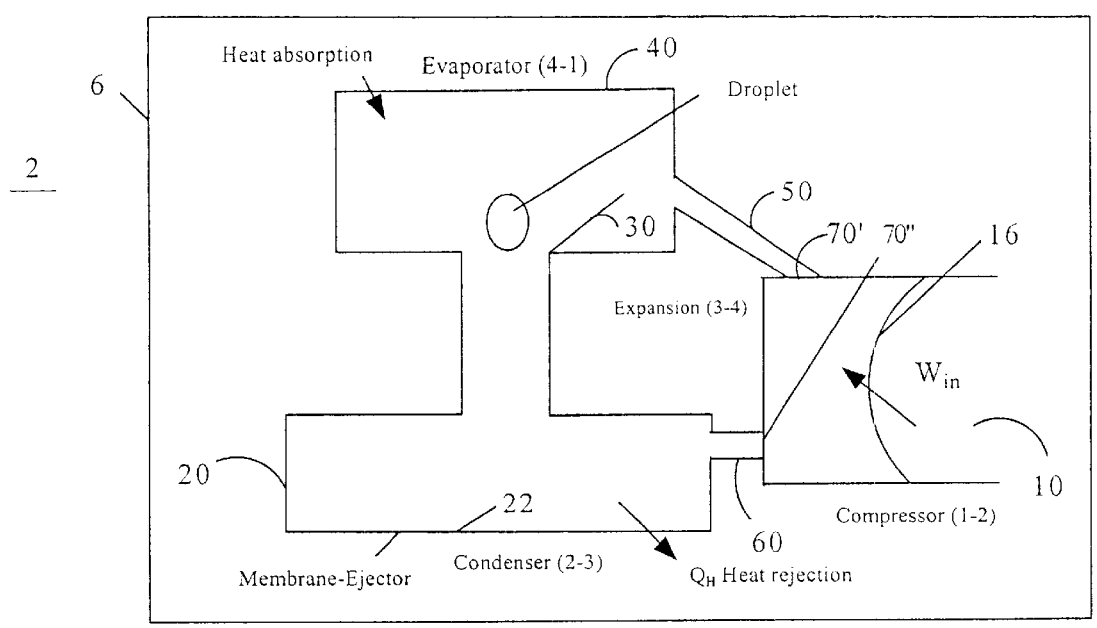
FIG. 1 is a schematic representation of the present invention.

Referring now is specific detail to the drawings in which like reference numerals designate like or equivalent elements throughout the several views, and initially to FIG. 1, the present invention is directed to a compact, integrated and self-contained vapor compression cycle heat transfer device 2. The device 2 of the invention includes a housing 6 having integrated compressor 10, condenser 20, expansion 30, and evaporator 40 structures, with the evaporator 40 structure removing heat from an adjacent atmosphere, fluid or object and the condenser 20 structure expelling heat into an adjacent atmosphere, fluid or object.

Figure 3:
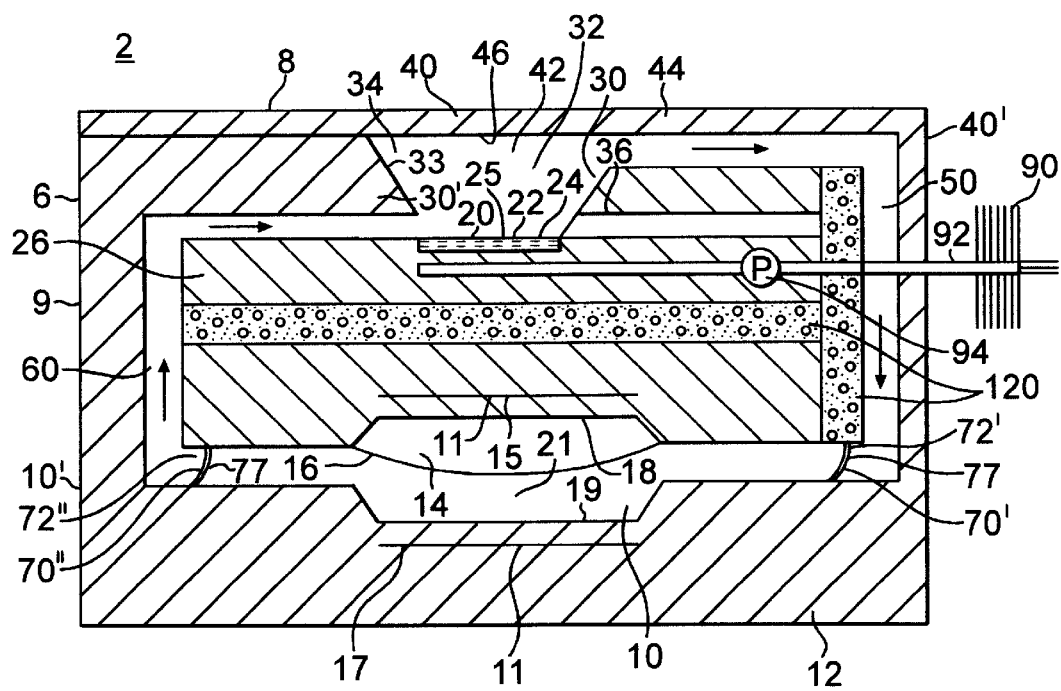
FIG. 3 is a schematic illustration of operation of a first embodiment of the present invention while the expansion valve is open.

Now referring to FIG. 3, generally, the compressor 10 structure includes a compressor body 12 defining a compressor cavity 14 and a flexible compressor diaphragm (or membrane) 16 mounted in the compressor cavity 14 that compresses refrigerant within a compressor portion 21 of the cavity 14 and promotes circulation of the refrigerant through a closed path defined through the compressor 10, condenser 20, expansion 30, and evaporator 40 structures. The condenser 20 structure includes a flexible condenser diaphragm (or membrane) 22 in fluid communication with the compressor portion 21 of the compressor 10 structure. The condenser diaphragm 22 includes a cooled condenser surface 24 that promotes growth of a plurality of refrigerant droplets thereon and propels the droplets from the condenser surface 24 of the condenser diaphragm 22 into the expansion 30 structure. The expansion 30 structure includes an expansion chamber 32 in fluid communication with the condenser 20 structure and which is in expansive receipt of the droplets propelled from the condenser diaphragm 22. Finally, the evaporator 40 structure includes an evaporator chamber 42 which is proximate a top end 34 of the expansion chamber 32 and which is in fluid communication with the expansion chamber 32 and the compressor portion 21 of the compressor 10 structure. As one will appreciate, the localized cooling and heating effect of the device 2 may be expanded via interconnection with like devices 2.

Figure 2A:
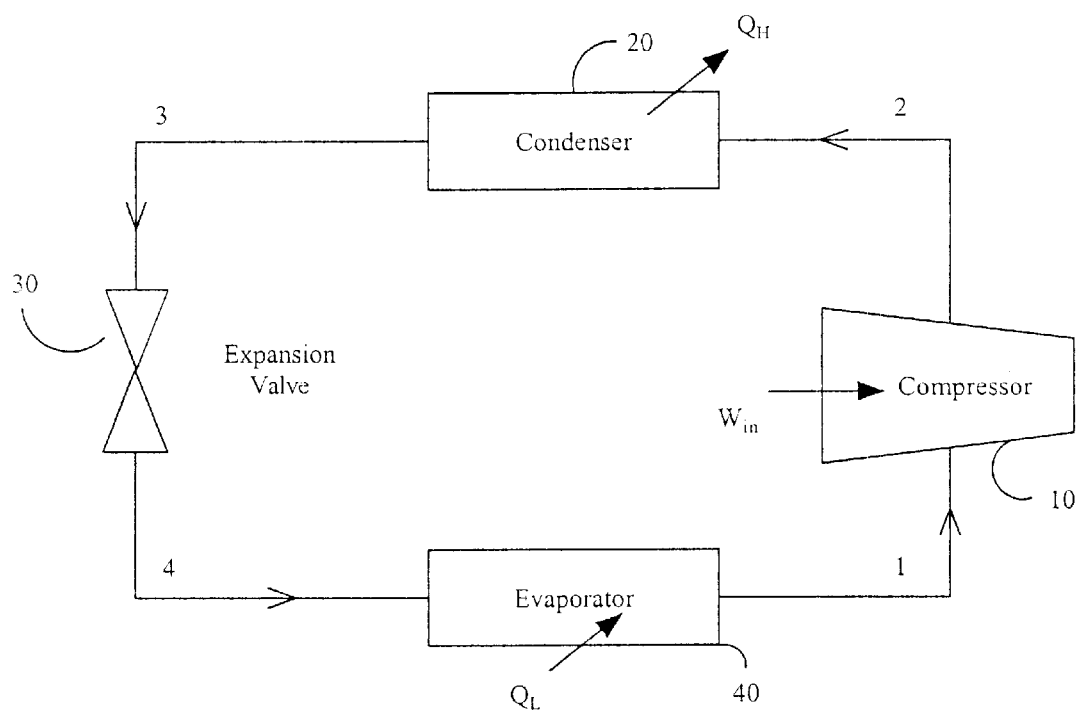
FIG. 2A is a schematic diagram of the vapor-compression refrigeration thermodynamic cycle followed by the present invention.
Figure 2B:
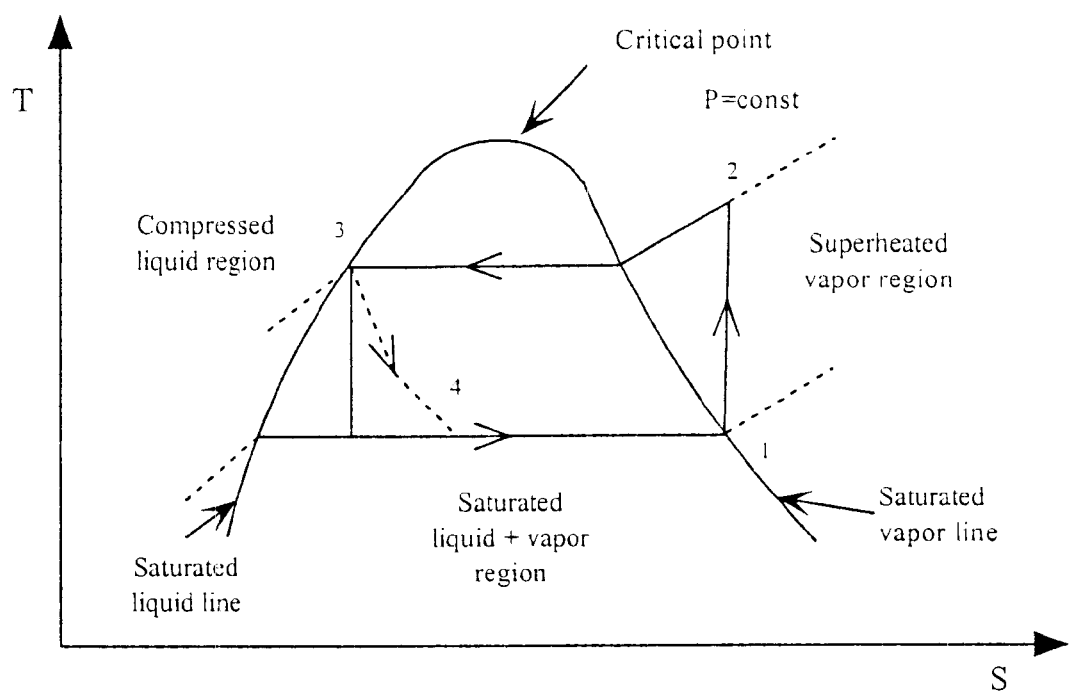
FIG. 2B is a schematic temperature-entropy diagram of the ideal vapor-compression refrigeration thermodynamic cycle followed by the present invention.
Figure 2C:
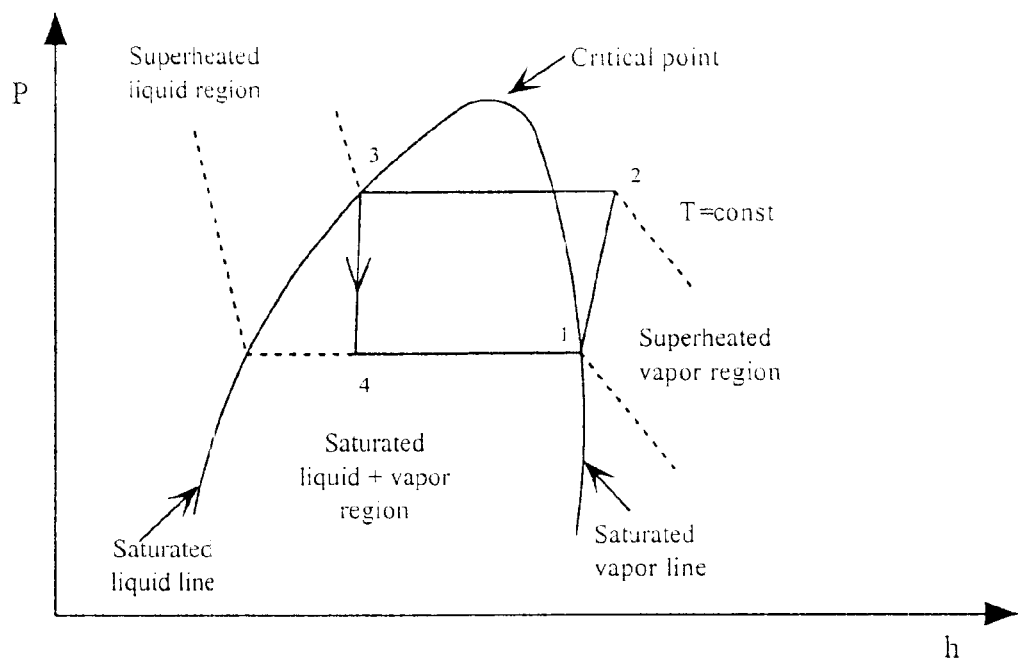
FIG. 2C is a schematic pressure-enthalpy diagram of the ideal vapor-compression refrigeration thermodynamic cycle followed by the present invention.

The heat transfer device 2 of the present invention follows a vapor-compression refrigeration cycle. As illustrated in FIGS. 2A–2C, the ideal vapor-compression refrigeration cycle includes four processes:

1-2: Isentropic compression in a compressor;
2-3: Constant pressure heat rejection in a condenser;
3-4: Throttling in an expansion device; and
4-1: Constant pressure heat absorption in an evaporator.

The coefficient of performance denoted COP is defined as the ratio of the cooling load ($\dot{Q}_L$) to the work output ($\dot{W}_{in}$):

$$COP = \dot{Q}_L / \dot{W}_{in}.$$

The preferred embodiment is designed to produce 2–6 Watts cooling capacity while operating between 20 deg. C. and 50 deg. C. At those conditions its actual coefficient of performance (COP) will be equal to the product of the ideal COP, the isentropic efficiency of the actual compressor, and any irreversibilities due to heat transfer, which is not precisely determined but is expected to be approximately 0.8. Thus, final COP of the device 2 is predicted to be in the approximate range of 4 to 7 COP. The robustness of the device 2 will permit operation over a wide range of conditions. As an example, its efficiency should be comparable at both 10 deg. C. and 40 deg. C., while pressure and flow rates would be correspondingly lower at the lower temperature. Power consumption should be in the range of about 0.4 to 0.9 W, while weight of an individual mass produced unit should be about 20–100 grams. Obviously, this opens a broad range of applications for the device 2 of the invention due to the small size, efficient cooling, and small power demand of the unit.

The small charge required by an individual device 2 also permits refrigerants which might not otherwise be considered in conventional units from being utilized since there are fewer toxicity and flammability concerns when used in a small individual device 2. Since the refrigerant charge of each device 2 is individual and self-contained, this concern also does not arise when many individual device 2s of the invention are operationally combined in an array. FC-72 is a preferred refrigerant pursuant to experiments conducted to date, but others are suitable. FC-72 is highly dielectric and provides an excellent insulating fluid for interfacing with electrical device 2s. Generally, preferred refrigerants will require low pressure lifts in the compressor, while exhibiting good thermodynamic properties. Example potential candidates include R12, R13, R13B1, R14, R21, R23, R115, R123a, R124, R134a R141b, R142b, R143, R152a, R218, RC270, RC318, R227ea, R236ea, R245cb, R600, pentane [n-pentane], 2-methyl butane [iso-pentane], R744, RE134, RE245, RE245ca, R236fa, R1270, R116, RE1170.

However, high volumetric flow refrigerants, such as water, are also suitable refrigerants.

Referring now to FIG. 3, a first embodiment of a heat transfer device 2 in accordance with the present invention is shown. The device 2 includes a generally layered structure, including a condenser layer 20' (including a flexible condenser diaphragm 22), a compressor layer 10' (including a body 12 and a flexible compressor diaphragm 16), an expansion layer 30' (including an expansion chamber 32), and an evaporator layer 40' (including an evaporator chamber 42). As noted above, operation of the device 2 is through a general vapor compression cycle with the compressor diaphragm 16 being electrically stimulated to compress refrigerant and drive refrigerant through the closed path defined within the device 2 which also includes an inlet conduit 50 and an outlet conduit 60. The condenser diaphragm 22 is electrically stimulated to propel refrigerant that has condensed on a condenser surface 24 of the condenser diaphragm 22 into the expansion chamber 32. Refrigerant circulates, heat is dispelled into the atmosphere by the condenser 20 on a portion of the device 2, and is absorbed from the atmosphere by the evaporator 40 on a top side 8 of the housing 6 of the device 2. The novel structure of the invention provides a compact, integrated, self-contained and generally modular device 2.

Figure 6:
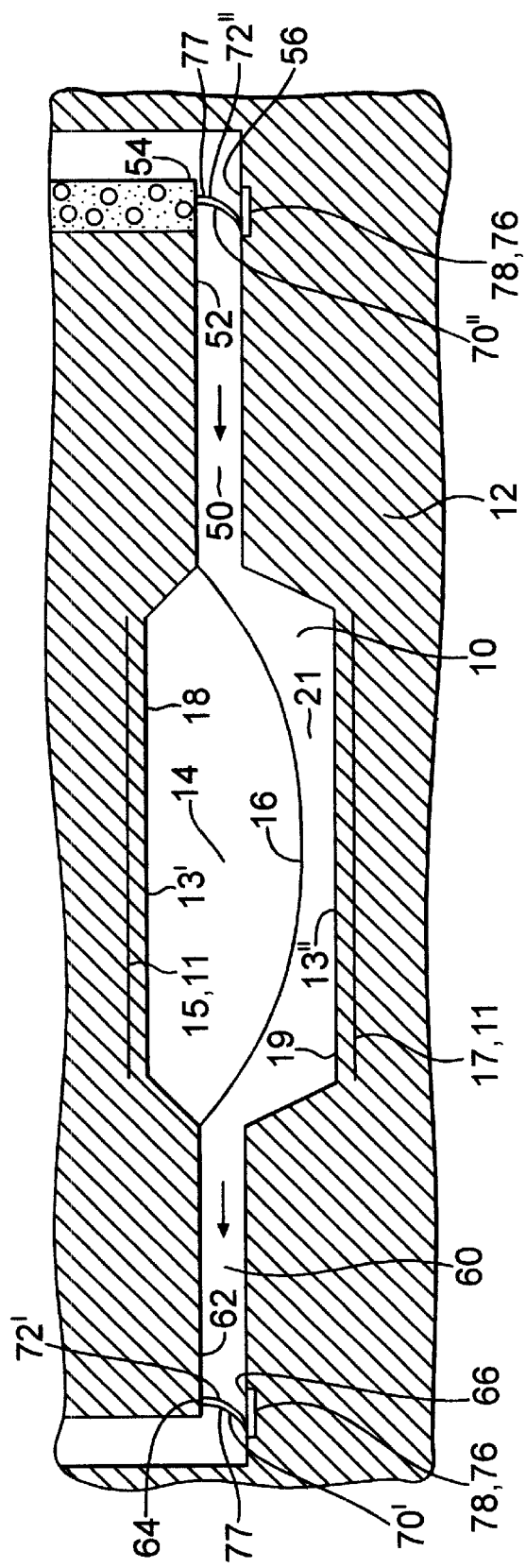
FIG. 6 shows a detail view of an exemplified electrostatically actuated compressor diaphragm.

As shown in FIGS. 3 and 6, an operational cycle of the device 2 starts with the refrigerant vapor being compressed by the compressor 10. The compression causes an increase in temperature of refrigerant fluid within the compressor cavity 14. The compressor has a body 12 that defines the compressor cavity 14. The body 12 may be typically formed from two connected compressor members 12a, 12b. The body 12 also mounts an electrically grounded compressor diaphragm 16 such that the diaphragm 16 is capable of movement within the compressor cavity 14. A voltage applied between a pair of opposing capacitive electrical contacts 11 disposed on opposing surfaces 13', 13" of the compressor cavity 14 creates a capacitive force between the conductive planes defined by the compressor cavity 14 and the flexible compressor diaphragm 16. In the illustrated embodiments, both surfaces of the compressor diaphragm 16 are conductive, while opposing portions of the outer surface 13', 13" of the compressor cavity 14 are conductive. Alternatives include having only one electrical contact on the outer surface 13 of the compressor cavity 14 and/or having only one conductive surface on the compressor diaphragm 16.

In the preferred embodiment, the opposing capacitive compressor electrical contacts 11 include an upper compressor electrode 15 and a lower compressor electrode 17. The compressor diaphragm 16 is adapted to selectively deflect toward the upper and lower compressor electrodes 15, 17. The upper and lower compressor electrodes 15, 17 are generally integral with opposing portions of the body 12 to form an upper electrode surface 18 and a lower electrode surface 19 in the compressor cavity 14. The compressor diaphragm 16 conforms to the respective electrode surfaces 18, 19 when it is electrostatically driven to one or the other surface through application of a voltage to the particular electrode 15, 17 via a voltage source for the upper compressor electrode 15 and a voltage source for the lower compressor electrode 17. The compressor diaphragm 16 and the upper and lower electrode surfaces 18, 19 may be coated with thin dielectric layers (not shown) for electrical insulation and protection.

In operation, the compressor diaphragm 16 is movable from a first relaxed position, to a second intake position, and to a third compressed position. In the first position, the upper and lower compressor electrodes 15, 17 are deactivated and the compressor diaphragm 16 is in its original, relaxed, position. In the second position, the upper and lower electrodes 15, 17 are activated with the appropriate polarization to move the compressor diaphragm 16 toward the upper compressor electrode 15 (toward the upper electrode surface 18) to maximize the available volume within the compressor portion 21 of the compressor cavity 14. Finally, in the third position, the upper and lower compressor electrodes 15, 17 are activated to move the compressor diaphragm 16 toward the lower compressor electrode 17 (toward the lower electrode surface 19) to minimize the volume within the compressor portion 21 of the compressor cavity 14. The movement of the compressor diaphragm 16 from the second position to the third position compresses and transforms the refrigerant into a superheated vapor. It is contemplated that the condenser diaphragm 16 will be actuated once per refrigeration cycle.

In the present invention, the compressor diaphragm 16 may be stretched or tensile loaded, however, it is preferred that the compressor diaphragm 16 be formed in a prebuckled shape, so that, in the first position, when the compressor diaphragm 16 is in the interim position between the upper and lower compressor electrodes 15, 17, the buckles compress and the shape of the compressor diaphragm 16 is somewhat irregular. Upon movement toward the upper or lower electrode surface 18, 19, the buckled diaphragm 16 straightens out to form a smooth, uniform surface that may fully engage the respective electrode surface 18, 19. Buckled diaphragms have a larger volume per stroke that can be obtained with reduced actuation force when compared to stretched or tensile loaded diaphragms. Additionally, buckled diaphragms are almost stress free in both the second and third positions which results in a system that is less sensitive to temperature variations.

The body 12 may be constructed of, for example, connected layers of silicon or by molding a high temperature plastic such as ULTEM®, (registered trademark of General Electric Company, Pittsfield, Mass.), CELAZOLE®, (registered trademark of Hoechst-Celanese Corporation, Summit, N.J.), or KETRON®, (registered trademark of Polymer Corporation, Reading, Pa.). The upper and lower electrodes 15, 17 themselves can be formed via common manufacturing methodologies such as, for example, printing, plating, sputtering, or EB deposition of metal followed by patterning by using dry film resist, as is known in the art. Low temperature organic and inorganic dielectric may also be used as an insulator between the actuating electrodes 15, 17.

The compressor diaphragm 16 may be made from metal coated polymers such as, for example, KAPTON® (registered trademark of E. I. du Pont de Nemours & Co., Wilmington, Del.), KALADEX®. (registered trademark of ICI Films, Wilmington, Del.) and MYLAR® (registered trademark of E. I. du Pont de Nemours & Co., Wilmington, Del.), metal, or a conductive flexibly elastic polymer that permits it to conform its surface area to the curved surfaces. Both metal and elastic polymer diaphragms can be flat or buckled. Typically, the polymeric material have elastomeric properties sufficient to permit movement between said curved surfaces. For example, fabrication of the diaphragm 16 is based upon technology developed for keyboard and flexible circuits that are produced in huge quantities making the fabrication process well optimized. Preferred diaphragms 16 are made from polymer films such as KAPTON® or MYLAR® (registered trademark of E. I. du Pont de Nemours & Co., Wilmington, Del.), or different polyesters that are commercially available.

As noted above, the closed loop formed within the device 2 also includes an inlet conduit 50 and an outlet conduit 60. Both the inlet and outlet conduits 50, 60 are microchannels that are in fluid communication with the compressor portion 21 of the compressor cavity 14. The inlet conduit 50 is also in fluid communication with the evaporator chamber 42. Further, the outlet conduit 60 is in fluid communication with the condenser diaphragm 22 of the condenser 20. Preferably, to enhance the efficiency of the compression stroke of the compressor 10, each conduit 50, 60 also contains a compressor valve 70 for controlling the flow of refrigerant into and out of the compressor portion 21 of the compressor cavity 14. The compressor valves 70 may be pressure actuated flapper valves, as known in the art, that open and close automatically due to the pumping action of the compressor 10. It is preferred however, to electrostatically actuate the compressor valves 70 to reduce leakage or back-pressure losses.

Figure 7:
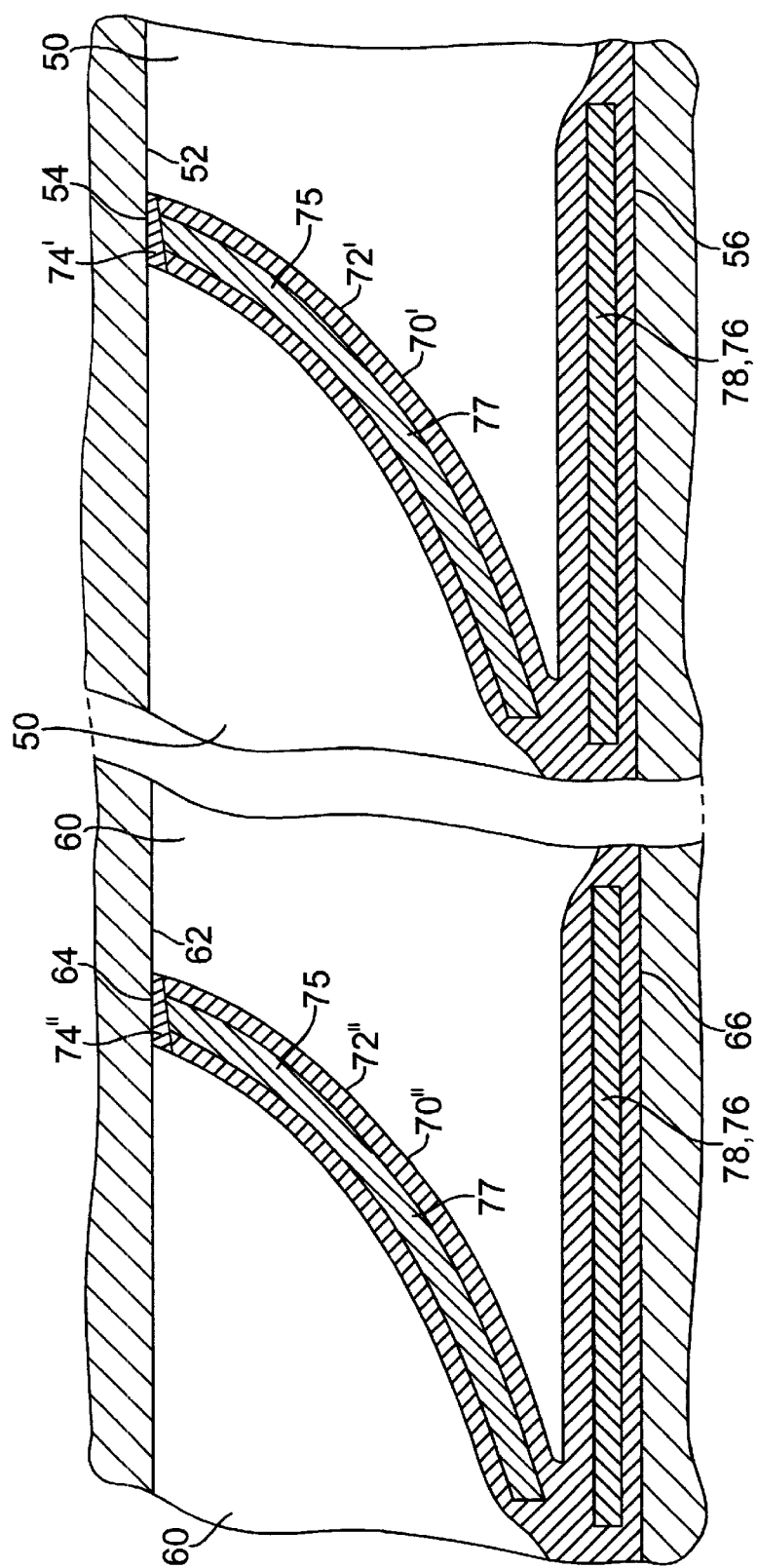
FIG. 7 shows a detail view of an exemplified electrostatically actuated compressor valve.

As shown in FIGS. 3 and 7, the inlet conduit 50 has an inlet wall surface 52 and the device 2 has a first compressor valve 70' disposed within the inlet conduit 50. Preferably, the first compressor valve 70' is a hinged tab 72' that has a sealing edge portion 74' that is complementarily shaped to a first portion 54 of the inlet wall surface 52. The tab 72 is hinged proximate a second portion 56 of the inlet wall surface 52. In similar fashion, the outlet conduit 60 has an outlet wall surface 62 and the device 2 has a second compressor valve 70" disposed within the outlet conduit 60. The second compressor valve 70" is a hinged tab 72" which has a sealing edge portion 74" that is complementarily shaped to a first portion 64 of the outlet wall surface 62. The tab 72" is hinged proximate a second portion 66 of the outlet wall surface 62. Thus, in operation, the first compressor valve 70' and the inlet wall surface 52 and the second compressor valve 70" and the outlet wall surface 62 form sealable contacts when the respective sealing edge portions 74', 74" of the compressor valves 70', 70" are placed into contact with the respective first portions 54, 64 of the inlet and outlet wall surfaces 52, 62 to prevent refrigerant flow through the inlet conduit 50 and/or the outlet conduit 60.

More particularly, the first compressor valve 70' is movable from a closed position to an open position. In the closed position, the sealing edge 74' of the first compressor valve 70' is sealed to the first portion 54 of the inlet wall surface 52 to prevent flow of fluid from the evaporator chamber 42 via the inlet conduit 50 into the compressor portion 21 of the compressor cavity 14. In the open position, the sealing edge 74' of the first compressor valve 70' is drawn away from the first portion 54 of the inlet wall surface 52 toward the second portion 56 of the inlet wall surface 52 (which, as noted above, is proximate the hinge of the first compressor valve 70'). As one will appreciate, as the sealing edge 74' of the first compressor valve 70' is drawn away from the first portion 54 of the inlet wall surface towards the second portion of the inlet wall surface, the inlet conduit 50 is opened which allows flow of refrigerant through the inlet conduit 50 and into the compressor portion 21 of the compressor cavity 14.

Similarly, the second compressor valve 70" is movable from a closed position to an open position. In the closed position, the sealing edge 74" of the second compressor valve 70" is sealed to the first portion 64 of the outlet wall surface 62 to prevent flow of fluid through the outlet conduit 60 and into the condenser 20. In the open position, the sealing edge 74" of the second compressor valve 70" is drawn away from the first portion 64 of the outlet wall surface 62 toward the second portion 66 of the outlet wall surface 62 (which, as noted above, is proximate the hinge of the second compressor valve 70"). As the sealing edge 74" of the second compressor valve 70" is drawn away from the first portion 64 of the outlet wall surface 62 towards the second portion 66 of the outlet wall surface 62, the outlet conduit 60 is opened which allows flow of refrigerant from the compressor portion 21 of the compressor cavity 14, through the outlet conduit 60 and into the condenser 20.

As noted above, the first and second compressor valves 70', 70" may comprise a hinged tab 72', 72" movable toward and away from the respective first and second portions 54, 64, 56, 66, of the respective inlet and outlet wall surfaces 52, 62. The tab 72', 72" is fixed at one end (i.e., hinged) in cantilever fashion with respect to the respective inlet and outlet wall surfaces 52, 62. The tab 72', 72" may be substantially rigid or, preferably, may be flexible. If the tab 72', 72" is flexible, it is preferred that the tab 72', 72" be formed from a polymeric material that has elastomeric properties. The movable tab 72', 72" may be formed through techniques known in the art, such as selective etching of a silicon member and/or the selective bonding of a polymer flap.

Figure 8:
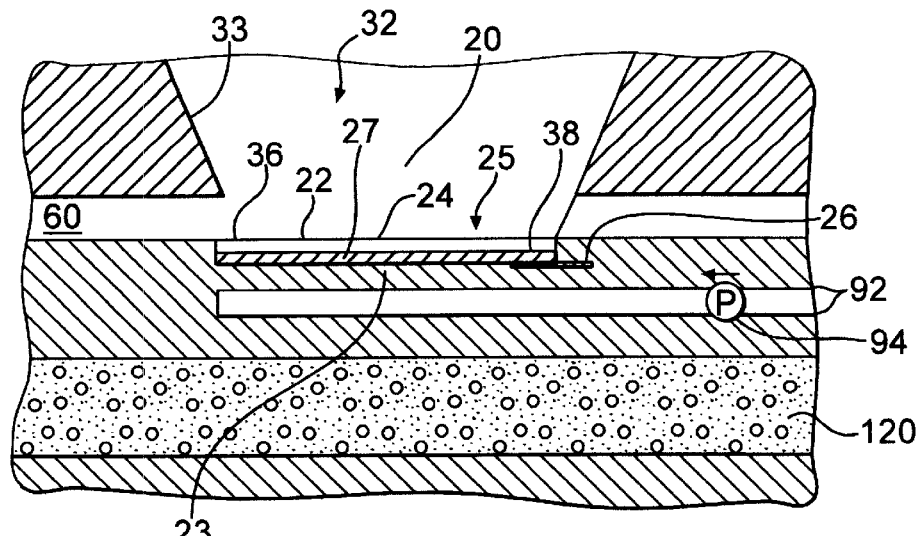
FIG. 8 shows a detail view of an exemplified piezoelectrically actuated compressor diaphragm.

The first and second compressor valves 70', 70" are preferably electrostatically controlled. Electrostatically controlled valves are well known in the art. Referring generally to FIG. 8, in this electrostatically controlled embodiment, each compressor valve 70', 70" further includes two opposing capacitive compressor valve electrical contacts 75, 76 on the tab 72', 72" and proximate the second portions 56, 66 of the respective inlet and outlet wall surfaces 52, 62. To utilize the capacitive action for the compressor valves 70', 70", the area about the second portions 56, 66 of the inlet and outlet wall surfaces 52, 62 must be made conductive, with a dielectric above the compressor valve electrical contact 76 within the inlet and outlet wall surfaces 52, 62. Similarly, the tab 72', 72" should have a conductive plane to mate with the conductive portion of the inlet and outlet wall surfaces 52, 62.

Preferably, the opposing capacitive compressor valve electrical contacts 75, 76 include a movable first compressor valve electrode 77 capsulated within the tab 72', 72" and a fixed second compressor valve electrode 78 integral to and proximate the dielectric second portions 56, 66 of the respective inlet and outlet wall surfaces 52, 62. As one will appreciate, the basic operation of the tab 72', 72" is simple; a voltage applied between the two compressor valve electrodes 77, 78 establishes an electrical attraction/repulsion. Operationally, the first and second compressor valve electrodes 77, 78 are selectively energized so that the tab 72', 72" is electrostatically positioned in the open or closed position. Normally, each tab 72', 72" (and thus each compressor valve 70', 70") is in the closed position. Power is supplied to the respective opposing compressor valve electrical contacts 75, 76 to provide potentials of opposite polarity in the first and second compressor valve electrodes 77, 78. This tends to draw the first and second compressor valve electrodes 77, 78 toward one another, eventually moving the tab 72', 72" into a complete open state. When power is supplied to the respective opposing compressor valve electrical contacts 77, 78 to provide potentials of identical polarity in the first and second compressor valve electrodes 77, 78, the compressor valve electrodes 77, 78 are forced away from one another, thus forcing the tab 72', 72" into the closure position.

In the preferred flexible embodiment, the tab 72', 72" returns to the closed position under an internal, elastic force upon application of equal potential to the respective compressor valve electrodes 77, 78 or the shorting of the compressor valve electrical contacts 75, 76. Thus, upon removal of the applied voltage, the inherent stress within the flexible tab 72', 72" curls the tab 72', 72" back into its original, closed, position.

Techniques for fabricating such an electrostatically driven tab 72', 72" are known in the art. In one example, the technique uses process and material used in the fabrication of VLSI integrated circuits. In this example five photolithographic steps are used to form the electrostatically actuated tab 72', 72", which, in this example, is flexible. Beginning with a silicon substrate with a polyimide insulating film, a Cr/Au/Cr metal film is deposited and pattered to form the second compressor valve electrode 78. A polyimide film is then deposited, to insulate the second compressor valve electrode 78 from the environment. A release film of PECVD oxide is then deposited and patterned. This film is wet etched away at the end of the process to free the flexible films from the substrate. Another polyimide film is deposited to protect the bottom of the first flexible compressor valve electrode 77 from the environment and to prevent charges from being transferred from the first compressor valve electrode 77 to the second compressor valve electrode 77 in the second portion 56, 66 of the wall surface 52, 62 of the respective inlet and outlet conduit 50, 60. This film is patterned to form vias between the flexible first compressor valve electrode 77 and the second compressor valve electrode 78 for ease of wiring the device 2. Then a second Cr/Au/Cr metal film is deposited and patterned to form the first compressor valve electrode 77. A final polyimide film is deposited and patterned to define the size and shape of the tab 72', 72" as well as to protect the top surface of the first compressor valve electrode 77 from the environment. This top film may be thicker than the bottom dielectric film in order to create stress in the tab 72', 72" which will cause the tab 72', 72" to reflexively curl away to the closed position in the respective inlet and outlet conduits 50, 60 when voltage is removed from the compressor valve electrodes 77, 78. The final step is to etch away the PECVD oxide with HF, which releases the flexible tab 72', 72" from the substrate. The fabrication steps used in this exemplified construction can be done with conventional, prior generation VLSI equipment, including contact photolithography. Further, the substrate may be, for example, silicon, metal, plastic, glass, or like materials.

In operation, when the compression process is complete, i.e., the compressor diaphragm 16 is in the third position, the second compressor valve 70" is selectively opened to let the superheated refrigerant vapor to flow through the outlet conduit 60 to the condenser 20. The first compressor valve 70' remains closed to reduce back-pressure losses. When all of the compressed superheated refrigerant has escaped to the condenser 20, the second compressor valve 70" is selected closed and will remain closed through out the remainder of the refrigeration cycle. The first compressor valve 70' is selected open to allow vaporized fluid from the evaporator chamber 42 to be drawn into the compressor 10.

Referring now to FIGS. 3 and 8, the drop-wise condenser 20 has a flexible condenser diaphragm 22 which is in fluid communication with compressed superheated refrigerant escaping the outlet conduit 60. The flexible condenser diaphragm 22 has a condenser surface 24 which may be covered with a thin film of hydrophobic material (not shown) to promote dropwise condensation thereon the condenser surface 24. The temperature of the condenser surface 24 is maintained at a generally constant temperature lower than the temperature of the superheated refrigerant vapor introduced via the outlet conduit 60. The temperature difference may, for example, be approximately 1° C. to 7° C., and preferably, may be approximately 2° C. to 5° C. For example, the temperature of the saturated vapor exiting the compressor 10 may be approximately 50° C. and the temperature of the condenser surface 24 may be approximately 53° C., for a temperature difference of approximately 3° C. Once the droplets have grown to a desired size, the condenser diaphragm 22 is actuated to eject or propel the condensed droplets away from the condenser surface 24 of the condenser diaphragm 22. As one will appreciate, the condenser diaphragm 22 will be actuated consistent with the rate of condensation of the selected refrigerant. In addition, consistent with the compressor diaphragm 16, it is contemplated that the condenser diaphragm 22 will be actuated once per refrigeration cycle. Alternatively, it is contemplated that the condenser diaphragm 22 may be actuated at a predetermined frequency throughout the refrigeration cycle.

The condenser diaphragm 22 is connected to an electromechanical actuator 25. A broad range of electromechanical actuators 25 which may be used with the present invention will be apparent to those skilled in the art and may utilize, for example, electrostatic, electromagnetic, piezoelectric, or magnetostrictive principles. However, preferably, the electromechanical actuator 25 is a piezoelectric actuator 25 which is operated by an electrical signal to its conductive condenser electrical contact 26.

In the exemplified embodiment, the condenser surface 24 of the condenser diaphragm 22 forms a portion of a substantially flat bottom end 36 of the expansion chamber 32. In a recess 38 defined within the bottom end 36, a thin film 27 of a piezoelectric material, forming the piezoelectric actuator 25, is seated therein and is in contact with the condenser electrical contact 26. A base surface 23 of the condenser diaphragm 22, which opposes the condenser surface 24 of the condenser diaphragm 22, is connected to the piezoelectric actuator 25. The condenser diaphragm 22 is connected to the edge area of the recess 38 so that the condenser surface 24 of the condenser diaphragm 22 is substantially planar to the bottom end 36 of the expansion chamber 32 when the condenser diaphragm 22 is in a first, unenergized, position. In this first position, the substantially planar condition of the condenser diaphragm 22 allows for the condensation of droplets on the condenser surface 24. As one will appreciate, upon application of a pulse voltage to the condenser electrical contact 26, the piezoelectric material 25 is actuated which forces the condenser diaphragm 22 to bow outward relative to the base surface 23 to a second position with sufficient force so that the condensed droplets of refrigerant are propelled from the condenser surface 24 toward the top end 34 of the expansion chamber 32.

The condenser further includes a heat exchanger means for cooling the condenser surface 24 of the condenser diaphragm 22. The heat exchanger means may comprise a heat-rejecting heat exchanger 90 that proximally bounds the condenser surface 24. More particularly, the heat exchanger means may include a heat exchanger 90, a fluid microchannel 92, and a fluid pump 94. The heat exchanger 90 may, for example, include a finned heat exchanger, such as known in the art, that is disposed on an exterior surface 9 of the housing 6 to reject heat to the surrounding atmosphere. The fluid microchannel 92 defines at least one closed flow path between the heat exchanger 90 and proximate the base surface 23 of the condenser 20. The fluid pump 94 is disposed in the fluid channel 92 so that fluid, such as a refrigerant, is circulated therethrough the fluid channel 92.

The fluid pump 94 allows fluid that has been conductively heated by the condenser surface 24 to be drawn through the heat exchanger 90 where excess heat from the circulating fluid is rejected to the atmosphere to cool the fluid. The cooled fluid is drawn back through the microchannel 92 proximate the condenser surface 24 to cool and maintain the condenser surface 24 at the generally constant temperature. A broad range of fluid pumps which may be used with the present invention will be apparent to those skilled in the art and may utilize, for example, electrostatic, electromagnetic, piezoelectric, or magnetostrictive principles. However, preferably, the fluid pump 94 is a piezoelectric fluid pump such as, for example, the micropump disclosed in U.S. Pat. No. 5,876,187 to Forster et al., which in incorporated herein in its entirety. Alternatively, the fluid pump 94 may be an electrostatically driven diaphragm pump as described above in respect to the compressor 10.

As one would appreciate, the expansion chamber 32 is in fluid communication with the condenser. The expansion chamber 32 has a wall surface 33 extending between the top end 34 and the bottom end 36 of the expansion chamber 32. The wall surface 33 defines a first orifice 35 proximate the bottom end 36 of the expansion chamber 32 that serves as the outlet for the outlet conduit 60. Further, the wall surface 33 defines a second orifice 37 proximate the top end 34 of the expansion chamber 32 that serves as the inlet for the inlet conduit 50. As the refrigerant passes through the expansion chamber 32, the temperature of the refrigerant undergoes a sudden drop. For example, the temperature may drop approximately 15° C. to 50° C., and, more preferably, approximately 20° C. to 40° C. Referring to FIG. 3, at least a portion of the wall surface 33 proximate the top end 34 of the expansion chamber 32 extends outwardly away from a longitudinal axis L of the expansion chamber 32. The top end 34 of the expansion chamber 32 has a first width that is greater than a second width of width of the expansion chamber 32 taken proximate the bottom end 36. Thus, the cross-sectional area of the expansion chamber 32 increases as the droplets pass from the bottom end 36 to the top end 34 of the expansion chamber 32 and into the evaporator chamber 42.

The refrigeration cycle then completes when the cooled refrigerant absorbs heat from the atmosphere or object proximate the device 2 in the evaporator 40. The evaporator chamber 42 has a conductive member 44 that may be placed into contact with a heat generating object for which cooling is desired. In the preferred embodiment the conductive member 44 forms at least a portion of the top side 8 of the housing 6 of the device 2. The evaporator chamber 42 is proximate the top end 34 of the expansion chamber 32 and is fluid communication with the expansion chamber 32. The conductive member 44 has an evaporation surface 46 upon which the cooled droplets impinge after passing though the top end 34 of the expansion chamber 32. The evaporation surface 46 may be coated with a thin film of metal (not shown) to insure that the refrigerant wets the evaporation surface 46 to provide a large heat transfer rate.

As noted, the impinged droplets provide cooling by evaporation. As the refrigerant evaporates it is returned to the compressor cavity 14 via the inlet conduit 50. As noted above, the first compressor valve 70' opens (while the second compressor valve 70" remains closed) to allow the vaporized refrigerant to pass into the compressor portion 21 of the compressor 10.

Figure 4:
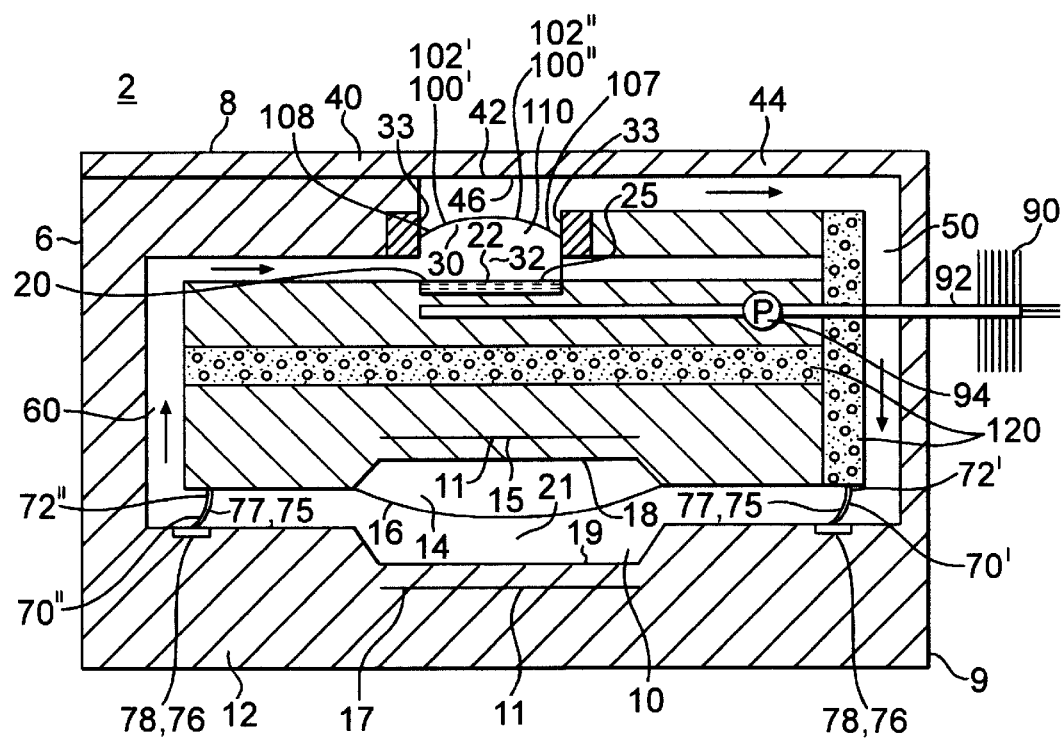
FIG. 4 is a schematic illustration of operation of a second embodiment of the present invention showing a first and a second expansion valve.
Figure 9:
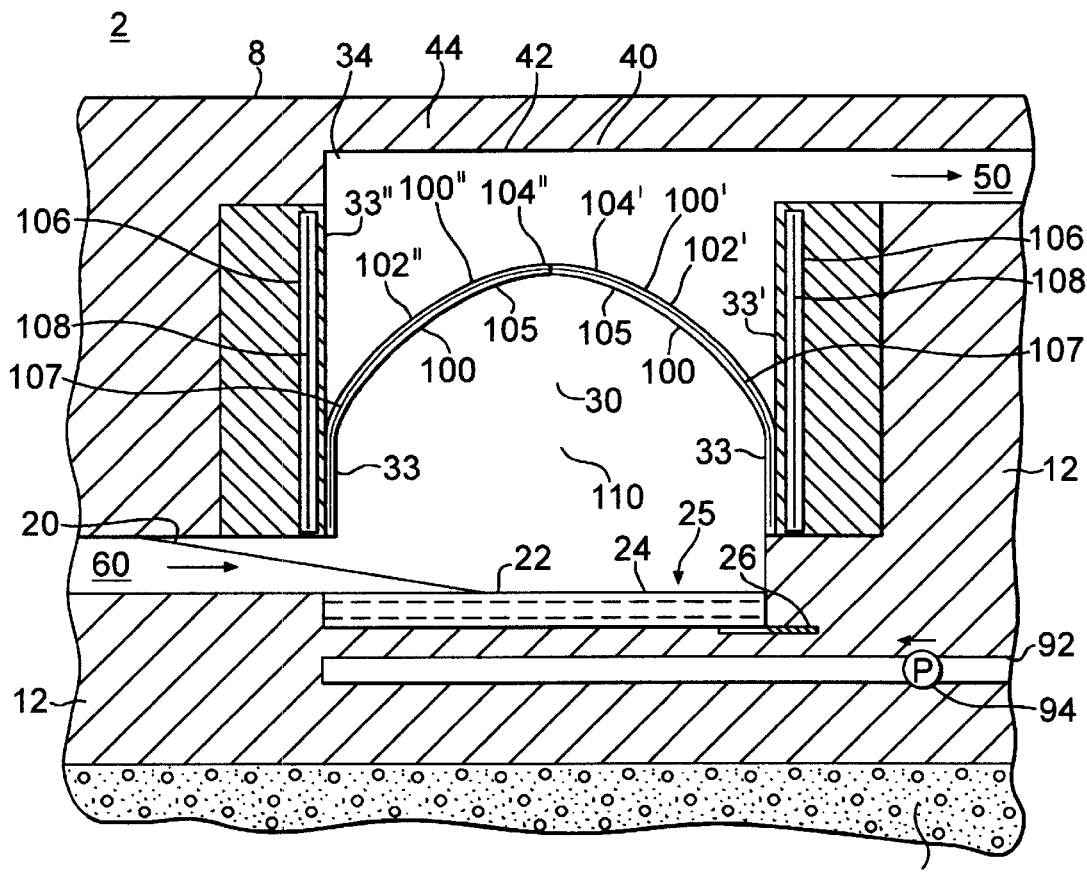
FIG. 9 shows a detail view of an exemplified first and a second electrostatically actuated expansion valves.

Referring now to FIGS. 4 and 9, a second embodiment of the device 2 is shown. The construction of the second embodiment of the device 2 is similar to the first embodiment of the device 2 and, accordingly, the figures use the same reference numbers for similar components. Furthermore, the components in FIGS. 1–4 and 5–9 that use the same reference numbers are substantially equivalent and the description thereof is omitted for the second embodiment. In this embodiment, at least one expansion valve 100 is connected to the wall surface 33 of the expansion chamber 32 intermediate the top end 34 and the bottom end 36 of the expansion chamber 32. The expansion valve 100 is moveable from a closed position, in which a cavity 110 bounding the condenser diaphragm 22 is defined by a portion of the wall surface 33 of the expansion chamber 32, the expansion valve 100, and the bottom end 36 of the expansion chamber 32 (which includes the condenser diaphragm 22), to an open position, in coordinated response to the activation of the condenser diaphragm 22, to allow droplets propelled from the condenser diaphragm 22 to pass though the expansion chamber 32 and into the evaporator chamber 42. After the droplets have passed the expansion valve 100, the expansion valve 100 returns to the closed position. In this embodiment, the cross-sectional area of the expansion chamber 32 may increase, or preferably, may be substantially constant from the bottom end 36 through the top end 34 of the expansion chamber 32.

While one expansion valve 100 may be used, it is preferred that a first expansion valve 100' and an opposing second expansion valve 100" be provided. Each of the first and second expansion valves 100', 100" generally is a tab 102', 102", having a distal end 104', 104", that is moveable toward and away from the wall surface 33 of the expansion chamber 32. More particularly, the first and second expansion valves 100', 100" are moveable from a closed position, in which the distal ends 104', 104" of the first and second expansion valves 100', 100" are sealed to one another to define the cavity 110 bounding the condenser diaphragm 22, to an open position, in which the distal ends 104', 104" of the first and second expansion valves 100', 100" are drawn toward opposing portions 33', 33" of the wall surface 33 of the expansion chamber 32 so that the condensed droplets may flow through the expansion chamber 32.

It is preferred that the each expansion valve 100', 100" be an electrostatically drive valve similar in operation and construction to the electrostatically driven first and second compressor valves 70', 70" discussed above. In this preferred embodiment, each expansion valve 100', 100" includes opposing capacitive expansion valve electrical contacts 105, 106 on the tab 102', 102" and a portion of the wall surface 33', 33" of the expansion chamber 32 which are adapted to selectively move one of the respective first and second expansion valves 100', 100". As one will appreciate, the opposing capacitive expansion valve electrical contacts 105, 106 for each of the first and second expansion valves 100', 100" comprise a first expansion valve electrode 107 encapsulated within the tab 102', 102" and a second expansion valve electrode 108 proximate the wall surface 33 of the expansion chamber 32. Preferably, the second expansion valve electrode 108 is integral with the body 12. Upon selective application of a voltage of desired polarity, the first and second expansion valve electrodes 107, 108 can be selectively energized so that the respective tabs 102', 102" are electrostatically positioned in the open or closed position. The tab 102', 102" may be substantially rigid, however, it is preferred that the tab 102', 102" is formed from a polymeric material having elastomeric properties.

Figure 5:
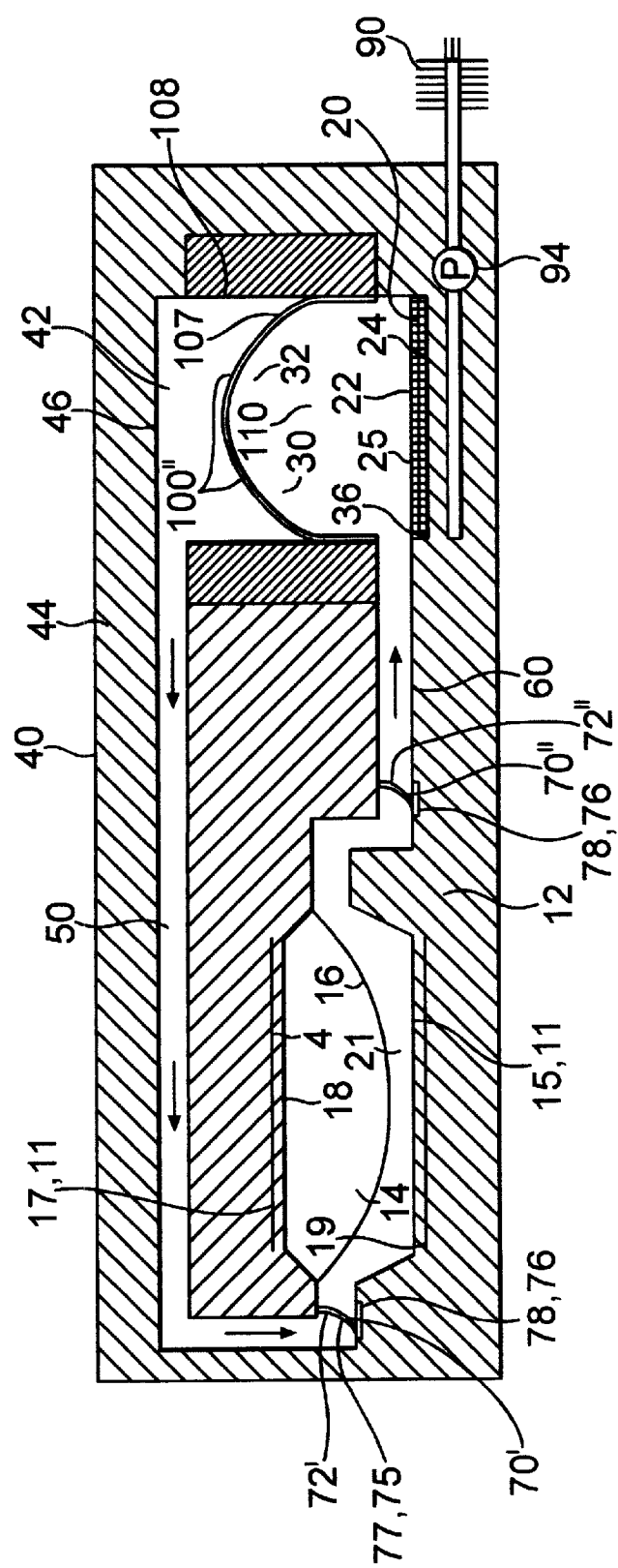
FIG. 5 is a schematic illustration of operation of a third embodiment of the present invention.

Referring to FIG. 5, a third embodiment of the device 2 is shown. The construction of the third embodiment of the device 2 is similar to the first and second embodiments of the device 2 and, accordingly, the figures use the same reference numbers for similar components. Furthermore, the components in FIGS. 1–9 that use the same reference numbers are substantially equivalent and the description thereof is omitted for the third embodiment. One skilled in the art will appreciate that the general structures of the compressor 10, the condenser 20, the expansion chamber 32, and the evaporator 40 are similar to the first and second embodiments described above. However, in this exemplified embodiment, the compressor 10 and the condenser 20 are formed within the same layer. This illustrates that many permutations of the layered approach to constructing the device 2 of the invention are possible and are contemplated.

Electrical vias provide electrical connections with the electromechanical actuator 25 of the condenser 20, and leads connect vias to the first and second compressor valves 70', 70" in the preferred electrostatically clamped compressor valve embodiment. Additional leads provide electrical connection to the compressor electrodes 15, 17 in the compressor cavity 14, preferably formed as multiple separate electrodes to encourage a zip action in the compressor 10 as it compresses. Still further leads connect vias and provide electrical connection to the expansion valve 100 in the electrostatically clamped expansion valve embodiment. Solder bumps in one layer oppose vias in another layer to provide electrical connections between layers in a manner commonly used to connect printed circuit board (PCB) layers. Outside control circuitry may be used to control compressor 10, condenser 20, compressor valve 70, and expansion valve 100 actions, or an on board chip may be included.

Efficient operation of the device 2 requires thermal isolation between hot and cool areas of the device 2. Isolation between the condenser and the compressor may be provided by the insertion of an insulator 120 between the relative hot and cold portions of the device 2. The insulator 120 can also serve as a portion of the electrical connection to outside power sources through electrical connection network.

The device 2 of the invention is fabricated according to a combination of macro and microfabrication techniques. Low end dimensions in the device 2 of the invention are realizable through microfabrication techniques, while higher dimension features may be achieved via low pressure injection molding techniques. Two construction approaches, however, are preferred (microfabrication, injection molding). The application (cross sectional area, refrigerant choice, operation pressure) may drive the final choice of fabrication methods. The preferred method of fabricating the invention employs a layered approach, or an approach similar to laminate manufacturing, in order to provide a robust method for high volume production. Individual components of the device 2 are partially or wholly fabricated in layers, and then are assembled and bonded together. Components are aligned to communicate electrically and to communicate refrigerant fluid with other components.

For use of the invention over long time periods, refrigerants under pressure may eventually be lost to the surroundings due to the permeability of the material and the subsequent diffusion of the high pressure gases through the polymer walls. The rate of loss varies greatly between different polymers and refrigerants. Small molecule refrigerants tend to diffuse more rapidly through solid polymers than those comprised of larger molecules. Different polymers are also more or less permeable to molecules of various chemistries. Long term loss is exacerbated since the invention employs relatively large surface areas, compared to the total amount of refrigerant charge used. A diffusion or vapor barrier comprised of a thin film of metal may be added between the layers and/or on exterior surface of the housing to reduce the potential for diffusion. If the metal vapor layer is on the surface, a thin polymer coating can be placed over it to protect it from wear.

Although the illustrative embodiments of the present disclosure have been described herein with reference to the accompanying drawings, it is to be understood that the disclosure is not limited to those embodiment, and the various other changes and modifications may be affected therein by one skilled in the art without departing from the scope of spirt of the disclosure. All such changes and modifications are intended to be included within the scope of the disclosure as defined by the appended claims.

What is claimed is:

1. A heat transfer device, comprising:
    a refrigerant loop including a compressor for providing a superheated vapor state from a vapor stream;
    a condenser comprising a membrane coupled to an actuator, said condenser including a condensing surface for condensing said superheated vapor into a plurality of droplets;
    an evaporator for receiving said plurality of droplets, and
    an expansion structure interposed between said condenser and said evaporator, wherein said actuated membrane ejects said plurality of droplets toward said evaporator during refrigerant cycle intervals when said expansion valve is open.

2. The device of claim 1, wherein said actuator comprises an electromechanical actuator.

3. The device of claim 2, wherein said electromechanical actuator comprises a magnetostrictive or piezoelectric material.

4. The device of claim 1, wherein said compressor includes a membrane coupled to an actuator.

5. The device of claim 1, wherein said compressor membrane comprises a metal coated polymer.

6. The device of claim 4, wherein said compressor membrane is responsive to electrical stimulation.

7. The device of claim 1, wherein said device is fully integrated.

8. The device of claim 1, wherein said condenser further comprises a heat exchanger to cool said condensing surface.

9. The device of claim 8, further comprising a housing, wherein said heat exchanger comprises a finned heat exchanger disposed on an exterior surface of said housing, a fluid channel defining a flow path between said heat exchanger and proximate to a surface of said membrane and a fluid pump disposed in said fluid channel for circulating said fluid.

10. The device of claim 9, wherein said fluid pump comprises a piezoelectric fluid pump.

11. The device of claim 1, wherein said expansion valve provides a fully closed state and a fully open state, wherein said condenser and evaporator are in open fluid communication during intervals of operation of said device during said fully open state.

12. The device of claim 11, wherein said expansion valve comprises a first valve portion and a second valve portion, said first and second valve portion being extended during said fully closed state and retracted during said fully open state.

13. The device of claim 11, wherein said expansion valve is electrostatically actuated.

14. The device of claim 1, wherein said device is integrally formed on a bulk integrated circuit substrate material, wherein at least one heat generating device is disposed in thermal contact with a surface of said evaporator.

15. The device of claim 14, wherein said heat generating device comprises an electronic device.

16. A method of heat transfer, comprising the steps of:
providing a heat transfer device, said heat transfer device including a refrigerant loop having a compressor for providing a superheated vapor state from a vapor stream, a condenser comprising a membrane coupled to an actuator, said condenser including a condensing surface for condensing said superheated vapor into a plurality of droplets, an evaporator for receiving said plurality of droplets, and an expansion structure interposed between said condenser and said evaporator;
forming said plurality of droplets on said condensing surface, and
spraying said plurality of droplets from said condensing surface toward said evaporator during refrigerant cycle intervals when said expansion valve is open.

17. The method of claim 16, wherein said actuator comprises an electromechanical actuator.

18. The method of claim 17, wherein said electromechanical actuator comprises a piezoelectric or magnetostrictive material.

19. The method of claim 16, wherein at least one heat generating device is disposed in thermal contact with a surface of said evaporator, further comprising the step of removing heat from said heat generating device.

20. The method of claim 19, wherein said heat generating device comprises an electronic device.

21. The method of claim 16, wherein said compressor includes a membrane coupled to an actuator.

22. The method of claim 21, wherein said compressor membrane comprises a metal coated polymer.

23. The method of claim 22, further comprising the step of electrostatically driving said compressor.

\* \* \* \* \*